United States Patent
Tsai et al.

(10) Patent No.: US 9,385,070 B2
(45) Date of Patent: Jul. 5, 2016

(54) SEMICONDUCTOR COMPONENT HAVING A LATERAL SEMICONDUCTOR DEVICE AND A VERTICAL SEMICONDUCTOR DEVICE

(71) Applicant: DELTA ELECTRONICS, INC., Taoyuan Hsien (TW)

(72) Inventors: Hsin-Chang Tsai, Taoyuan Hsien (TW); Chia-Yen Lee, Taoyuan Hsien (TW); Peng-Hsin Lee, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 21 days.

(21) Appl. No.: 13/930,817

(22) Filed: Jun. 28, 2013

(65) Prior Publication Data

US 2015/0001692 A1 Jan. 1, 2015

(51) Int. Cl.
*H01L 23/522* (2006.01)
*H01L 23/528* (2006.01)
(Continued)

(52) U.S. Cl.
CPC ........ *H01L 23/495* (2013.01); *H01L 23/49524* (2013.01); *H01L 23/49562* (2013.01); *H01L 23/49575* (2013.01); *H01L 24/40* (2013.01); *H01L 25/18* (2013.01); *H01L 23/3107* (2013.01); *H01L 23/4952* (2013.01); *H01L 23/49527* (2013.01); *H01L 23/49531* (2013.01); *H01L 23/5221* (2013.01); *H01L 2224/16245* (2013.01); *H01L 2224/32145* (2013.01); *H01L 2224/32245* (2013.01); *H01L 2224/40095* (2013.01); *H01L 2224/40245* (2013.01); *H01L 2224/40247* (2013.01);
(Continued)

(58) Field of Classification Search
CPC .............. H01L 23/495; H01L 23/4951; H01L 23/49541; H01L 23/49558; H01L 23/49575; H01L 23/52; H01L 25/043; H01L 25/0657; H01L 25/074; H01L 25/0756; H01L 25/117; H01L 2225/06503; H01L 2225/06506; H01L 2225/0651; H01L 2225/06513; H01L 2225/06517; H01L 2225/0652; H01L 2225/06524; H01L 23/49577; H01L 23/4952; H01L 23/49524; H01L 23/49527; H01L 23/49531
USPC ................................................. 257/676, 686
See application file for complete search history.

(56) References Cited

U.S. PATENT DOCUMENTS

| 5,192,987 | A | 3/1993 | Khan et al. |
| 6,849,882 | B2 | 2/2005 | Chavarkar et al. |

(Continued)

FOREIGN PATENT DOCUMENTS

| EP | 2477221 | 7/2012 |
| TW | 200810079 | 2/2008 |

*Primary Examiner* — David Zarneke
(74) *Attorney, Agent, or Firm* — Hauptman Ham, LLP

(57) ABSTRACT

A semiconductor component comprising a lateral semiconductor device, a vertical semiconductor device, and a leadframe is provided. The lateral semiconductor device has a first side and a second side, and a first electrode, a second electrode, and a control electrode positioned on the first side. The vertical semiconductor device has a first side and a second side, a second electrode and a control electrode of it positioned on the second side and a first electrode of it positioned on the first side. The leadframe electrically and respectively connected to each of the first electrode of the lateral semiconductor device, the second electrode of the lateral semiconductor device, the second electrode of the vertical semiconductor device, and the control electrodes, wherein the first side of the vertical semiconductor device is mounted on the second side of the lateral semiconductor device, and the first electrodes of both devices are electrically connected.

20 Claims, 6 Drawing Sheets

(51) Int. Cl.
*H01L 23/535* (2006.01)
*H01L 23/538* (2006.01)
*H01L 23/495* (2006.01)
*H01L 25/18* (2006.01)
*H01L 23/00* (2006.01)
*H01L 23/31* (2006.01)

(52) U.S. Cl.
CPC ............ *H01L 2224/48091* (2013.01); *H01L 2224/48247* (2013.01); *H01L 2224/73221* (2013.01); *H01L 2224/73255* (2013.01); *H01L 2924/13063* (2013.01); *H01L 2924/13091* (2013.01)

(56) References Cited

U.S. PATENT DOCUMENTS

| | | | |
|---|---|---|---|
| 7,271,470 B1 * | 9/2007 | Otremba .............. H01L 23/492 257/666 |
| 7,291,869 B2 * | 11/2007 | Otremba ........................ 257/107 |
| 7,443,014 B2 * | 10/2008 | Otremba ........................ 257/676 |
| 7,569,920 B2 * | 8/2009 | Otremba .............. H01L 23/481 257/177 |
| 7,732,929 B2 * | 6/2010 | Otremba et al. ............... 257/777 |
| 7,800,217 B2 * | 9/2010 | Otremba et al. ............... 257/700 |
| 7,880,285 B2 * | 2/2011 | Hosseini ............ H01L 23/49531 257/686 |
| 7,880,288 B2 | 2/2011 | Otremba |
| 8,399,970 B2 * | 3/2013 | Urushihata ................... 257/676 |
| 8,466,561 B2 * | 6/2013 | Otremba .......... H01L 23/49575 257/678 |
| 8,679,896 B2 * | 3/2014 | Joshi et al. ................... 438/113 |
| 9,018,744 B2 * | 4/2015 | Otremba et al. ............... 257/676 |
| 9,041,986 B2 * | 5/2015 | Yi ...................... H04N 1/00249 358/475 |
| 2002/0031865 A1 * | 3/2002 | Chen et al. ................... 438/123 |
| 2005/0006730 A1 * | 1/2005 | Owens et al. ................. 257/666 |
| 2005/0017339 A1 * | 1/2005 | Yoshiba et al. ............... 257/686 |
| 2005/0224945 A1 * | 10/2005 | Saito et al. .................... 257/686 |
| 2006/0169976 A1 | 8/2006 | Kameda et al. |
| 2007/0132079 A1 * | 6/2007 | Otremba ............. H01L 23/3107 257/685 |
| 2007/0262346 A1 * | 11/2007 | Otremba ............... H01L 23/481 257/177 |
| 2008/0006923 A1 * | 1/2008 | Otremba ........... H01L 23/49551 257/686 |
| 2008/0224300 A1 * | 9/2008 | Otremba ................. H01L 24/33 257/693 |
| 2009/0134503 A1 * | 5/2009 | Feng et al. ..................... 257/673 |
| 2009/0174047 A1 | 7/2009 | Irving et al. |
| 2009/0261462 A1 | 10/2009 | Gomez |
| 2010/0122454 A1 * | 5/2010 | Fan et al. ......................... 29/827 |
| 2011/0227207 A1 * | 9/2011 | Yilmaz ............. H01L 23/49537 257/676 |
| 2012/0168922 A1 * | 7/2012 | Cho .................. H01L 23/49524 257/676 |
| 2012/0217616 A1 * | 8/2012 | Matsuoka ............ H01L 23/495 257/532 |
| 2012/0228696 A1 * | 9/2012 | Carpenter et al. ............. 257/329 |
| 2012/0280308 A1 * | 11/2012 | Disney .......................... 257/329 |
| 2013/0027113 A1 * | 1/2013 | Otremba et al. ............... 327/423 |
| 2013/0043940 A1 | 2/2013 | Hebert et al. |
| 2013/0299845 A1 * | 11/2013 | Nomoto ................. H01L 21/561 257/76 |
| 2014/0003179 A1 * | 1/2014 | Girdhar ................ H01L 21/50 365/226 |
| 2014/0061884 A1 * | 3/2014 | Carpenter et al. ............. 257/676 |
| 2014/0175628 A1 * | 6/2014 | Pan et al. ....................... 257/676 |
| 2014/0264804 A1 * | 9/2014 | Terrill et al. .................. 257/676 |
| 2014/0273344 A1 * | 9/2014 | Terrill ............... H01L 23/49575 438/107 |
| 2015/0206868 A1 * | 7/2015 | Zhang .................... H01L 24/40 438/108 |
| 2015/0236005 A1 * | 8/2015 | Yilmaz ................... H01L 25/50 438/107 |
| 2015/0243589 A1 * | 8/2015 | Ho ......................... H01L 24/40 257/329 |
| 2015/0303128 A1 * | 10/2015 | Otremba ............... H01L 25/105 257/676 |

* cited by examiner

SEMICONDUCTOR COMPONENT HAVING A LATERAL SEMICONDUCTOR DEVICE AND A VERTICAL SEMICONDUCTOR DEVICE

BACKGROUND

1. Technical Field

The present disclosure relates to a semiconductor component, and more particularly, to a semiconductor component in which a stack has both lateral and vertical semiconductor devices.

2. Description of Related Art

III-V compound semiconductors such as Gallium Arsenide (GaAs), Gallium Nitride (GaN) are increasingly being provided, in that the devices made therefrom like high electron mobility transistors (HEMTs) are known possessing special characteristics e.g., in high-power performance, different from conventional silicon-based semiconductors.

Unlike the design rule of silicon-based semiconductor device, the formation of the conductive channel of a III-V compound semiconductor device applies the difference between the band gaps of the respective layers in the devices. Due to the band gaps vary among the layers, a two-dimensional electron gas (2DEG) is formed at the interface of these layers. The 2DEG serves as a conductive channel, as that disclosed in the U.S. Pat. Nos. 5,192,987 and 6,849,882. In this regard, a lateral semiconductor device, which the source, drain, and gate electrodes therein are positioned on the same side of the semiconductor device, is now the only form provided in such III-V compound-based semiconductor devices.

On the other hand, a semiconductor component, in which two or more semiconductor devices are stacked and packaged, has become increasingly popular so as to improve the performance and packaging area thereof. Therefore, it is desirable to provide a semiconductor component which accommodates both lateral semiconductor device and vertical semiconductor device in the stacked semiconductor devices.

SUMMARY

The present disclosure provides a semiconductor component comprising a lateral semiconductor device, a vertical semiconductor device, and a leadframe. The lateral semiconductor device has a first side, a second side. The lateral semiconductor device has an active region, positioned on the first side, comprising a first electrode, a second electrode, and a control electrode. The vertical semiconductor device has a first side and a second side, a first electrode positioned on the first side, a second electrode and a control electrode positioned on the second side. The leadframe electrically and respectively connected to each of the first electrode of the lateral semiconductor device, the second electrode of the lateral semiconductor device, the second electrode of the vertical semiconductor device, and the control electrodes, wherein the first side of the vertical semiconductor device is mounted on the second side of the lateral semiconductor device, and wherein the first electrode of the lateral semiconductor device is also electrically connected to the first electrode of the vertical semiconductor device According to one embodiment of the present disclosure, the first side of the lateral semiconductor device faces to the leadframe. (FIG. 1,2,3,4,5,6)

According to one embodiment of the present disclosure, the control electrode of the lateral semiconductor device is electrically connected to the second electrode of the vertical semiconductor device. (FIG. 3,4,5,6)

According to one embodiment of the present disclosure, further comprising a passivation layer positioned on the first side of the lateral semiconductor device. (FIG. 3,4,5,6)

According to one embodiment of the present disclosure, the leadframe comprises a plurality of portions.

According to one embodiment of the present disclosure, at least two of the plurality of portions are substantially coplanar.

According to another embodiment of the present disclosure, at least two of the plurality of portions are substantially non-coplanar.

According to one embodiment of the present disclosure, further comprising a first connector electrically connecting the first electrode of the lateral semiconductor device and the first electrode of the vertical semiconductor device. (FIG. 2)

According to one embodiment of the present disclosure, further comprising a conductive layer on the second side of the lateral semiconductor device, wherein the first electrode of the vertical semiconductor device contacts the conductive layer, and the first connector electrically connects the first electrode of the lateral semiconductor device and the conductive layer. (FIG. 5)

According to one embodiment of the present disclosure, the first connector comprises a clip, ribbon, or bonding-wire.

According to one embodiment of the present disclosure, further comprising a second connector contacts both the second electrode of the vertical semiconductor and the leadframe. (FIG. 4)

According to one embodiment of the present disclosure, the second connector comprises a clip, ribbon, or bonding-wire.

According to one embodiment of the present disclosure, further comprising a third connector contacts both the control electrode of the vertical semiconductor device and the leadframe. (FIG. 6)

According to one embodiment of the present disclosure, the third connector comprises a clip, ribbon, or bonding-wire.

According to one embodiment of the present disclosure, the lateral semiconductor device comprises a metal-insulator-semiconductor field-effect transistor (MISFET), a metal semiconductor field effect transistor (MESFET), or a High-electron-mobility transistor (HEMT).

According to one embodiment of the present disclosure, the lateral semiconductor device comprises a nitride-based power transistor.

According to one embodiment of the present disclosure, the first electrode of the lateral semiconductor device is a source electrode, the second electrode of the lateral semiconductor device is a drain electrode, the first electrode of the vertical semiconductor device is a drain electrode, the second electrode of the vertical semiconductor device is a source electrode, the control electrodes of the lateral and the vertical semiconductor devices are gate electrodes.

According to one embodiment of the present disclosure, the lateral semiconductor device has a thickness larger than that of the vertical semiconductor device.

BRIEF DESCRIPTION OF THE DRAWINGS

The disclosure may be more fully understood by reading the following detailed description of the embodiment, with reference made to the accompanying drawings as follows.

DETAILED DESCRIPTION

Figure 1:
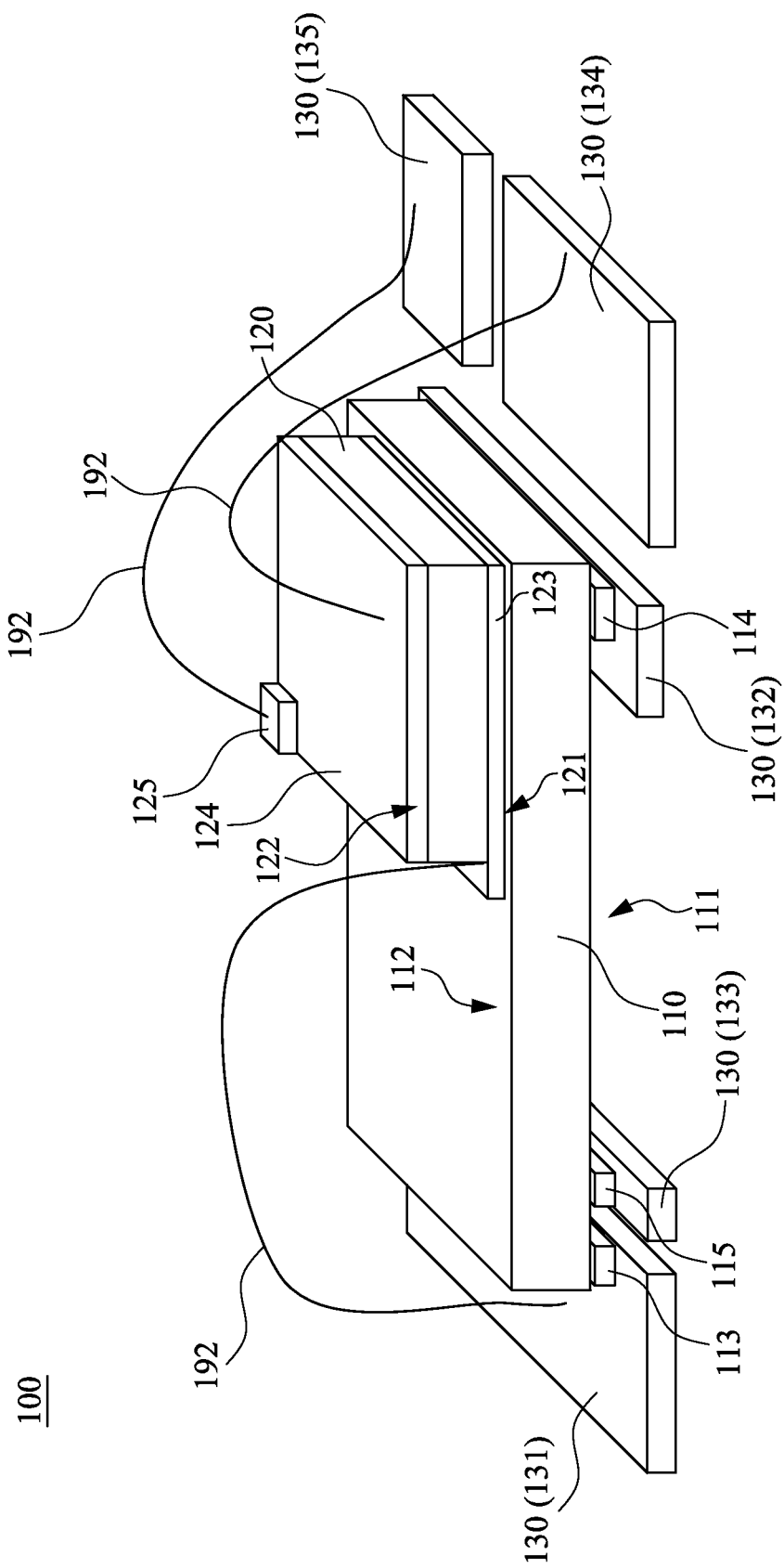
FIG. 1 illustrates the structure of one embodiment of the present disclosure.

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

As used herein, the singular forms "a," "an" and "the" include plural referents unless the context clearly dictates otherwise. Therefore, reference to, for example, a data sequence includes aspects having two or more such sequences, unless the context clearly indicates otherwise.

Reference will now be made in detail to the embodiments of the present disclosure, examples of which are illustrated in the accompanying drawings. Wherever possible, the same reference numbers are used in the drawings and the description to refer to the same or like parts.

Referring to FIG. 1, the semiconductor component 100 of the present disclosure comprises a lateral semiconductor device 110, a vertical semiconductor device 120, and a leadframe 130.

The lateral semiconductor device 110 has a first side 111 and a second side 112. As illustrated in FIG. 1, the second side 112 refers to the upper surface of the lateral semiconductor device 110; and the first side 111 refers to the lower surface of the lateral semiconductor device 110.

The lateral semiconductor device 110 also has an active region, positioned on the first side 111, comprising a first electrode 113, a second electrode 114, and a control electrode 115 positioned on the first side 111 (the lower surface). The lateral semiconductor device 110 of the present disclosure can be metal-insulator-semiconductor field-effect transistor (MISFET), a metal semiconductor field effect transistor (MESFET) or a High-electron-mobility transistor (HEMT), which is made of a silicon-based semiconductor or a compound semiconductor and not limited to it. For the devices aforementioned, the first electrode 113 of the lateral semiconductor device is a source electrode, the second electrode 114 of the lateral semiconductor device is a drain electrode, and the control electrode 115 of the lateral semiconductor device is a gate electrode. In one embodiment of the present disclosure, the lateral semiconductor device 110 is a HEMT device, which includes several wide bandgap material layers, such as III-V semiconductor layers. In an embodiment, the lateral semiconductor device comprises a channel layer made of GaN and a barrier layer made of AlGaN. Due to the different band gaps of the two layers, a two-dimensional electron gas (2DEG) is formed at the interface therebetween, the 2DEG serving as a conductive channel. The mobility of the electrons as well as the 2D-electron charge carrier density is very high in the two-dimensional electron gas, which is provided in an active region between the first electrode 113 of the lateral semiconductor device 110 (the source electrode) and the second electrode 115 of the lateral semiconductor device 110 (the drain electrode).

The vertical semiconductor device 120 has a first side 121 and a second side 122. As illustrated in FIG. 1, the second side 122 refers to the upper surface of the vertical semiconductor device 120; and the first side 121 refers to the lower surface of the vertical semiconductor device 120.

The vertical semiconductor device 120 has a second electrode 124 and a control electrode 125 positioned on the second side 122 (the upper surface), and a first electrode 123 positioned on the first side 121 (the lower surface). The vertical semiconductor device 120 of the present disclosure can be one of a metal-oxide-semiconductor field-effect transistor (MOSFET), but not limited to it. For a MOSFET device, the first electrode 123 of the vertical semiconductor device 120 is a drain electrode, the second electrode 124 of the vertical semiconductor device 120 is a source electrode, and the control electrode 125 of the vertical semiconductor device 120 is a gate electrode.

The leadframe 130 electrically and respectively connecting to each of the first electrode 113 of the lateral semiconductor device 110, the second electrode 114 of the lateral semiconductor device 110, the second electrode 124 of the vertical semiconductor device 120, the control electrode 115 of the lateral semiconductor device 110, and the control electrode 125 of the vertical semiconductor device 120. In one embodiment of the present disclosure, the leadframe 130 comprises a plurality of portions. As illustrated in FIG. 1, the plurality of portions includes portions 131, 132, 133, 134 and 135. The portion 131 of the leadframe 130 is electrically connected to the first electrode 113 of the lateral semiconductor device 110; the portion 132 of the leadframe 130 is electrically connected to the second electrode 114 of the lateral semiconductor device 110; the portion 133 of the leadframe 130 is electrically connected to the control electrode 115 of the lateral semiconductor device 110; the portion 134 of the leadframe 130 is electrically connected to the second electrode 124 of the vertical semiconductor device 120; and the portion 135 of the leadframe 130 is electrically connected to the control electrode 125 of the vertical semiconductor device 120. It should be noticed that the first side 121 of the vertical semiconductor device 120 is mounted on the second side 112 of the lateral semiconductor device 110, and the first electrode 113 of the lateral semiconductor device 110 is also electrically connected to the first electrode 123 of the vertical semiconductor device 120. In one embodiment of the present disclosure, the first side 111 of the lateral semiconductor device 110 faces to the leadframe 130.

As shown in FIG. 1, the first electrode 113, the second electrode 114, and the control electrode 115 of the lateral semiconductor device 110 are respectively flip-chip bonded to the portion 131 of the leadframe 130, the portion 132 of the leadframe 130, and the portion 133 of the leadframe 130. In other words, the first electrode 113, the second electrode 114, and the control electrode 115 of the lateral semiconductor device 110 are disposed on their corresponding portions 131, 132, and 133 of the leadframe 130. It should be noticed that all electrodes (the first electrode 113, the second electrode 114, and the control electrode 115) of the lateral semiconductor device 110 of the present disclosure can be bonded to their corresponding leadframe in a single step, flip-chip bonding, since these electrode are positioned on the same side of the lateral semiconductor device 110.

As illustrated in FIG. 1, the bonding-wires 192 connect the second electrode 124 of the vertical semiconductor device 120 to the portion 134 of the leadframe 130, the control electrode 125 of the vertical semiconductor device 120 to the portion 135 of the leadframe 130, and the first electrode 113 of the lateral semiconductor device 110 to the first electrode 123 of the vertical semiconductor device 120. It should be noticed that one of the bonding-wire 192 is both electrically connected to the first electrode 113 of the lateral semiconductor device 110 and the first electrode 123 of the vertical semiconductor device 120. Therefore, the lateral semiconductor device 110 and the vertical semiconductor device 120 are not only packaged in one stacked structure. More importantly, a series connection of the lateral semiconductor device 110 and the vertical semiconductor device 120 are formed since the first electrode 113 of the lateral semiconductor device 110 and the first electrode 123 of vertical semiconductor device 120 are electrically connected. In one embodiment of the present disclosure, the bonding-wire 192 comprises one of the gold, gold alloy, aluminum, an aluminum alloy, copper and a copper alloy.

In one embodiment of the present disclosure, the first electrode 113 of the lateral semiconductor device 110 is a source electrode, the second electrode 114 of the lateral semiconductor device 110 is a drain electrode, and the control electrode 125 is a gate electrode of the lateral semiconductor device 110; the first electrode 123 of the vertical semiconductor device 120 is a drain electrode, the second electrode 124 of the vertical semiconductor device 120 is a source electrode, and the control electrode 125 is a gate electrode of the vertical semiconductor device 120, so as to the current flow within the semiconductor component 100 flows in the portion 132 of the leadframe 130 to the second electrode 114 of the lateral semiconductor device 110, the first electrode 113 of the lateral semiconductor device 110, the portion 131 of the leadframe 130, the first electrode 123 of the vertical semiconductor device 120, the second electrode 124 of the vertical semiconductor device 120, and finally flows out from the portion 134 of the leadframe 130. The control electrode 125 of the vertical semiconductor device 120 is a switch to turn on/off the current between the first electrode 123 of the vertical semiconductor device 120 and the second electrode 124 of the vertical semiconductor device 120 by inputting signal to the portion 135 of the leadframe 130; and the control electrode 115 of the lateral semiconductor device 110 is a switch to turn on/off the current between the second electrode 114 of the lateral semiconductor device 110 and the first electrode 113 of the lateral semiconductor device 110 by inputting signal to the portion 133 of the leadframe 130. In one embodiment, the portion 134 of the leadframe 130 is electrically connected to the portion 133 of the leadframe 130. In other words, the second electrode 124 of the vertical semiconductor device 120 is electrically connected to the control electrode 115 of the lateral semiconductor device 110.

In another embodiment of the present disclosure, the first electrode 113 of the lateral semiconductor device 110 is a drain electrode, the second electrode 114 of the lateral semiconductor device 110 is a source electrode, and the control electrode 125 is a gate electrode of the lateral semiconductor device 110; the third electrode 123 is a source electrode, the second electrode 124 of the vertical semiconductor device 120 is a drain electrode, and the control electrode 125 is a gate electrode of the vertical semiconductor device 120, so as to the current flow within the semiconductor component 100 flows in the portion 134 of the leadframe 130 to the second electrode 124 of the vertical semiconductor device 120, the first electrode 123 of the vertical semiconductor device 120, the portion 131 of the leadframe 130, the first electrode 113 of the lateral semiconductor device 110, the second electrode 114 of the lateral semiconductor device 110, and finally flows out from the portion 132 leadframe 130. Similarly, the control electrode 125 of the vertical semiconductor device 120 is a switch to turn on/off the current between the second electrode 124 of the vertical semiconductor device 120 and the first electrode 123 of the vertical semiconductor device 120 by inputting signal to the portion 135 of the leadframe 130; and the control electrode 115 of the lateral semiconductor device 110 is a switch to turn on/off the current between the first electrode 113 of the lateral semiconductor device 110 and the second electrode 114 of the lateral semiconductor device 110 by inputting signal to the portion 133 of the leadframe 130.

In one embodiment of the present disclosure, at least two of the plurality of portions are substantially coplanar. As illustrated in FIG. 1, all portions 131, 132, 133,134, and 135 of the leadframe 130 are substantially coplanar. Therefore, the signals of input, output, and switch of the semiconductor component 100 can be simply performed by single-side bonding the semiconductor component 100 to. However, in another embodiment of the present disclosure, at least two of the plurality of portions are substantially non-coplanar. The positions of the protions of the leadframe 130 can be altered in different designs, coplanar or non-coplanar, to varieties of needs. As shown in FIG. 1, in one embodiment of the present disclosure, the portion 131 of the leadframe 130, the portion 132 of the leadframe 130, and the portions 133 of the leadframe 130, which are respectively flip-chip bonded to the first electrode 113, the second electrode 114, and the control electrode 115 of the lateral semiconductor device 110, are coplanar (since the first electrode 113, the second electrode 114, and the control electrode 115 are all positioned on the first side 111 of the lateral semiconductor device 110). The electrically connections between two elements which are positioned on different height levels, such as the portion 134 of the leadframe 130 to the second electrode 124 of the vertical semiconductor device 120, the portion 135 of the leadframe 130 to the control electrode 125 of the vertical semiconductor device 120, and the portion 131 of the leadframe 130 to the first electrode 123 of the vertical semiconductor device 120) are formed by connecting aforementioned elements with bonding-wires 192.

Figure 2:
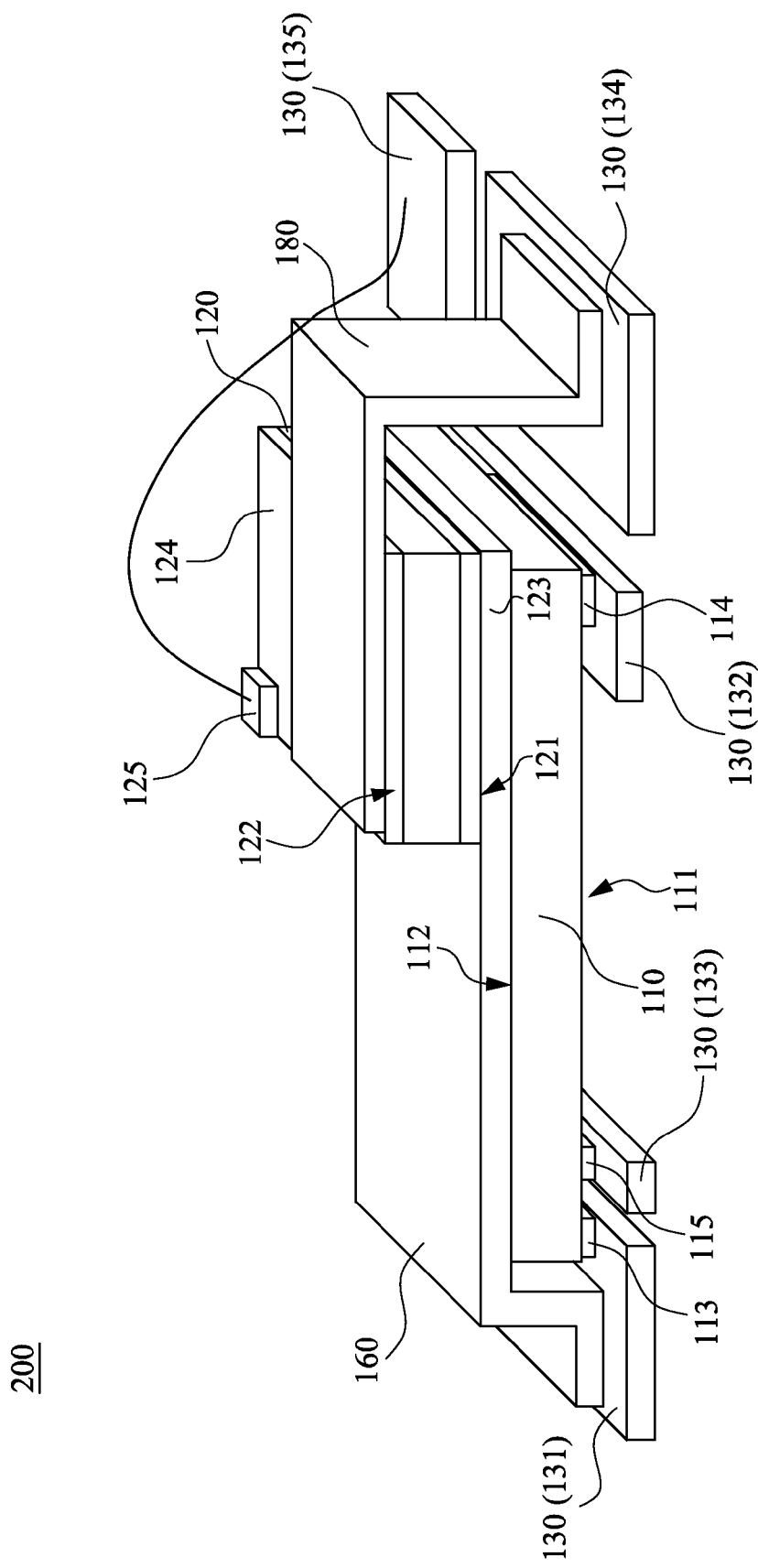
FIG. 2 illustrates the structure of another embodiment of the present disclosure.

However, bonding-wire 192 is not the only option to electrically connect the elements which are positioned on different height levels. In one embodiment of the present disclosure, further comprising a first connector 160 electrically connecting the first electrode 113 of the lateral semiconductor device 110 and the first electrode 123 of the vertical semiconductor device 120. In another embodiment of the present disclosure, further comprising a second connector 180 contacts both the second electrode 124 of the vertical semiconductor 120 and the leadframe 130. As illustrated in FIG. 2, the electrically connection between the portion 131 of the leadframe 130 and the first electrode 123 of the vertical semiconductor device 120, and the electrically connection between the portion 134 of the leadframe 130 and the second electrode 124 of the vertical semiconductor device 120 can be formed by applying the first connector 160 and the second connector 180 respectively. In one embodiment of the present disclosure, the first connector 160 comprises a clip, ribbon, or bonding-wire. In another embodiment of the present disclosure, the second connector 180 comprises a clip, ribbon, or bonding-wire. As illustrated in FIG. 2, the first connector 160 is a metal clip connects both the portion 131 of the leadframe 130 and the first electrode 123 of the vertical semiconductor device 120, such that the first electrode 113 of the lateral semiconductor device 110 is electrically connected to the first electrode 123 of the vertical semiconductor device 120 to form the series connection of the lateral semiconductor device 110 and the vertical semiconductor device 120.

Also illustrated in FIG. 2, the second connector 180 is a metal clip connects both the portion 134 of the leadframe 130 and the second electrode 124 of the vertical semiconductor device 120, such that the signal input/output of the semiconductor component 200 can be performed. It should be noticed that since the metal clips has wider cross-section than that of the bonding-wires 192, therefore the capability to carrying current flow of the metal clips is much better than that of the bonding-wires 192. Accordingly, the semiconductor component 200 illustrated in FIG. 2 has better capability to be operated in high current flow than that of the semiconductor component 100 illustrated in FIG. 1. In addition, the metal clips also have wide surfaces which help diffuse the heat, which is generated in component operation, from the semiconductor component 200 to its surrounding. If a device is over-heated by its heat accumulation, damages of the device are expected. The heat accumulation is more serious while the device is operated in high current flow. Accordingly, the semiconductor component 200 illustrated in FIG. 2 has better reliability to be operated in high current flow than that of the semiconductor component 100 illustrated in FIG. 1. In one embodiment of the present disclosure, the metal clipmay include a material selected from the group of, Ni, Al, Cu, Ag, Au and alloy thereof.

Figure 3:
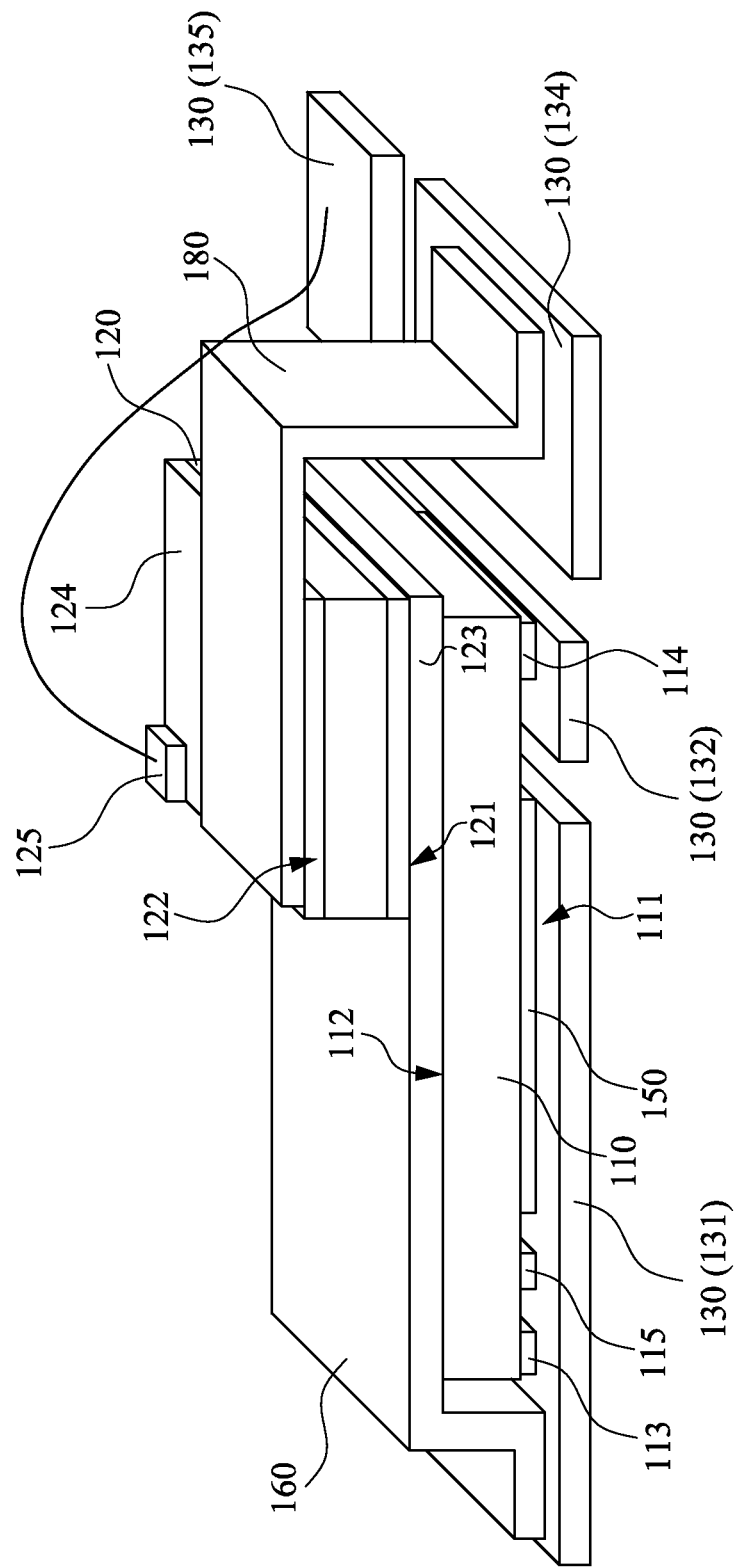
FIG. 3 illustrates the structure of another embodiment of the present disclosure.

As illustrated in FIG. 3, in one embodiment of the present disclosure, the control electrode 115 of the lateral semiconductor device 110 is electrically connected to the first electrode 123 of the vertical semiconductor device 120. For example, the first electrode 113 and the control electrode 115 of the lateral semiconductor device 110 have flip-chip contacts to the common portion 131 of the leadframe 130. In other words, the control electrode 115 of the lateral semiconductor device 110 does not need to be controlled independently, and its corresponding portion 133 of the leadframe 130, as illustrated in FIG. 1 and FIG. 2, can be further eliminated. In one embodiment of the present disclosure, the first electrode 113 of the lateral semiconductor device 110 is a source electrode, the second electrode 114 of the lateral semiconductor device 110 is a drain electrode, and the control electrode 125 is a gate electrode of the lateral semiconductor device 110; the first electrode 123 of the vertical semiconductor device 120 is a drain electrode, the second electrode 124 of the vertical semiconductor device 120 is a source electrode, and the control electrode 125 is a gate electrode of the vertical semiconductor device 120, so as to the current flow within the semiconductor component 300 flows in the portion 132 of the leadframe 130 to the second electrode 114 of the lateral semiconductor device 110, the first electrode 113 of the lateral semiconductor device 110, the portion 131 of the leadframe 130, the first electrode 123 of the vertical semiconductor device 120, the second electrode 124 of the vertical semiconductor device 120, and finally flows out from the portion 134 leadframe 130. The control electrode 125 of the vertical semiconductor device 120 is a switch to turn on/off the current between the first electrode 123 and the second electrode 124 of the vertical semiconductor device 120 by inputting signal to the portion 135 of the leadframe 130, however, the lateral semiconductor device 110, which is in series connection (also cascode connection) with the vertical semiconductor device 120, does not need to be controlled independently. To be more specific, when the portion 131 of the leadframe 130 receives the current flow from the second electrode 114 of the lateral semiconductor device 110, the current flow subsequently flows to both the first electrode 113 of the lateral semiconductor device 110 (source electrode) and the control electrode 115 of the lateral semiconductor device 110 (gate electrode) simultaneously. Therefore, the lateral semiconductor device 110 is automatically turning on while vertical semiconductor device 120 is turning on and the current flow flows in its first electrode 113 of the lateral semiconductor device 110 (source electrode) since the current flow also flows in its control electrode 115 of the lateral semiconductor device 110 (gate electrode) in the same time. In this case, the semiconductor component 300 substantially possesses only one control electrode 125 (gate electrode), positioned on the second side 122 of the vertical semiconductor device 120, to control the series connection (also cascode connection) of the lateral semiconductor device 110 and the vertical semiconductor device 120. In general, the selection of the vertical semiconductor device 120 is usually fast switching than that of the lateral semiconductor 110. In one embodiment of the present disclosure, the lateral semiconductor device 110 has a thickness larger than that of the vertical semiconductor device 120. Therefore the vertical semiconductor device 120 has faster response to driving signals flow in its control electrode 125 (gate) than that of the lateral semiconductor device 110. Accordingly, on/off controlling of the semiconductor component 300 is easier and faster since the semiconductor component 300 has a simpler design than that of the semiconductor components 100 and 200.

In another embodiment of the present disclosure, the semiconductor 300 further comprises a passivation layer 150 positioned on the first side 111 of the lateral semiconductor device 110. As illustrated in FIG. 3, the passivation layer 150 is positioned on the first side 111 to cover and protect the active area of the lateral semiconductor device 110. The active area includes the current channel between the first electrode 113 and the second electrode 114. The passivation layer 150 covers the active area so that the active area is not directly exposed to air or moisture from surrounding, and the lifetime of the lateral semiconductor device 110 is extended. The passivation layer 150 may include a material selected from the group of $Si_xN_y$, $SiO_2$ and $Al_2O_3$.

In one embodiment of the present disclosure, as illustrated in FIG. 3, the passivation layer 150 contacts the portion 131 of the leadframe 130 which have the flip-chip contacts to both the first electrode 113 and the control electrode 115 of the lateral semiconductor device 110. The passivation layer 150 receives the heat generated in the active area of the lateral semiconductor device 110 and further diffuses the heat to the portion 131 of the leadframe 130. It reduces the heat accumulation, and increases the reliability of the semiconductor component 300.

Figure 4:
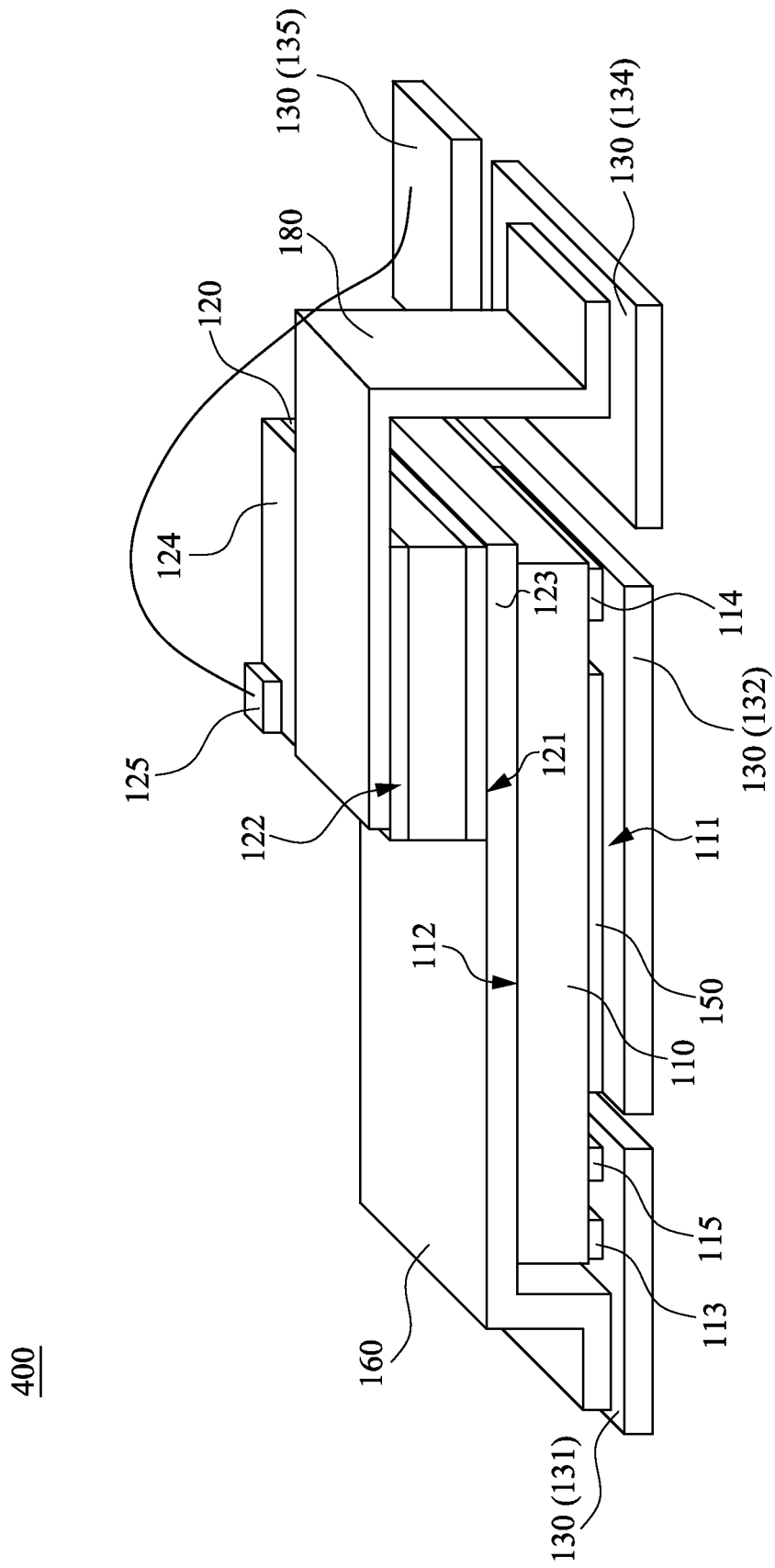
FIG. 4 illustrates the structure of another embodiment of the present disclosure.

In another embodiment of the present disclosure as illustrated in FIG. 4, the passivation layer 150 contacts the portion 132 of the leadframe 130 which have the flip-chip contact to the second electrode 114 of the lateral semiconductor device 110. The passivation layer 150 also receives the heat generated in the active area of the lateral semiconductor device 110 and further diffuses the heat to the portion 132 of the leadframe 130. Similarly, the heat accumulation of the semiconductor module 400 is reduced, and reliability of the semiconductor module 400 is improved.

Figure 5:
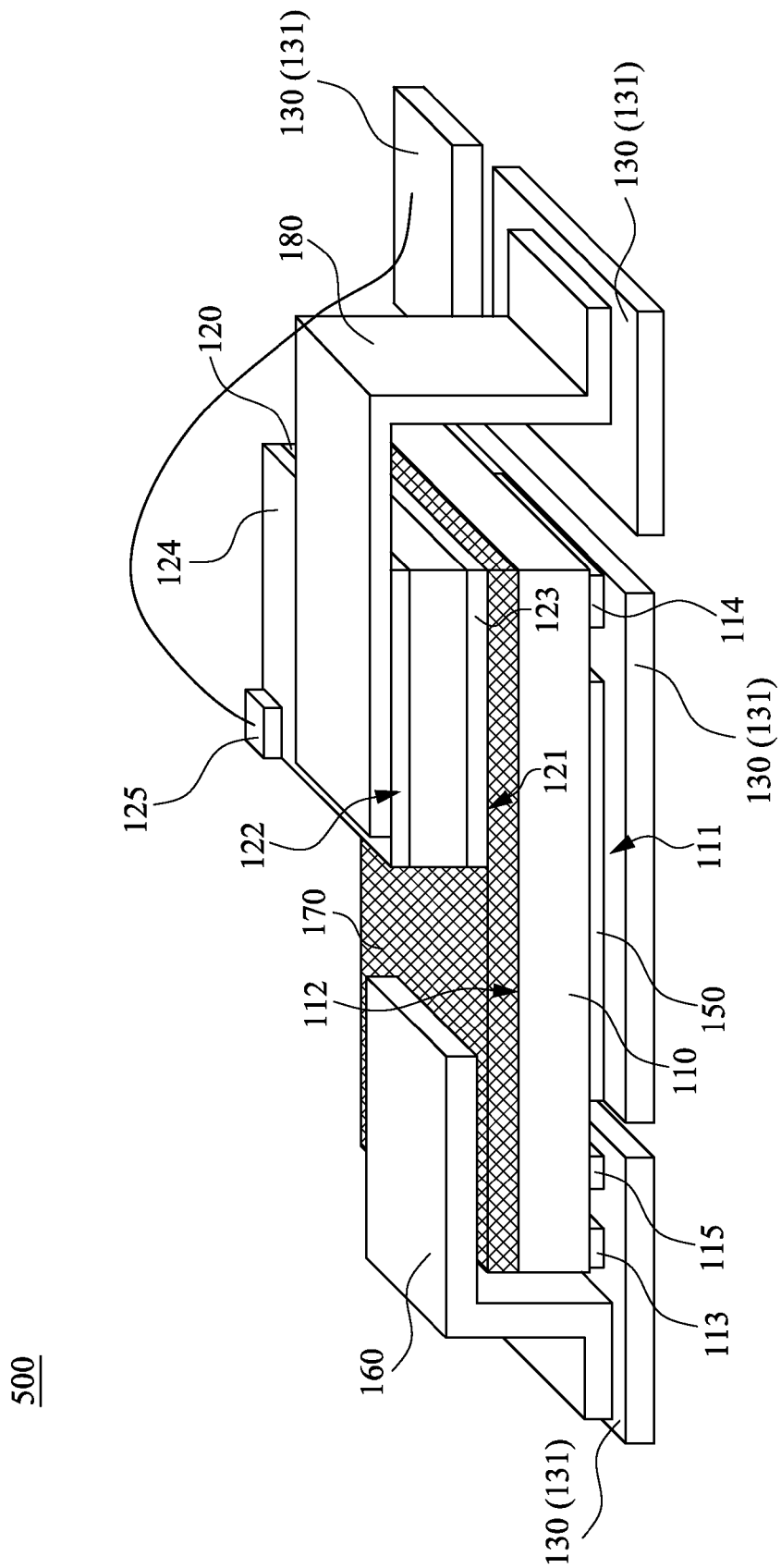
FIG. 5 illustrates the structure of another embodiment of the present disclosure.

As illustrated in FIG. 5, in one embodiment of the present disclosure, the semiconductor component 500 further comprises a conductive layer 170 on the second side of the lateral semiconductor device 110, wherein the first electrode 123 of the vertical semiconductor device 120 contacts the conductive layer 170, and the first connector 160 contacts both the first electrode 113 of the lateral semiconductor device 110 and the conductive layer 170. That is, the first connector 160 does not contact the first electrode 123 of the vertical semiconductor device 120 directly, but contacts the conductive layer 170 which contacts the first electrode 125 of the vertical semiconductor device 120. Therefore, the electrical connection of the first electrode 123 of the vertical semiconductor device 120 and the first electrode 113 of the lateral semiconductor device 110 is also established as the previous embodiments.

Figure 6:
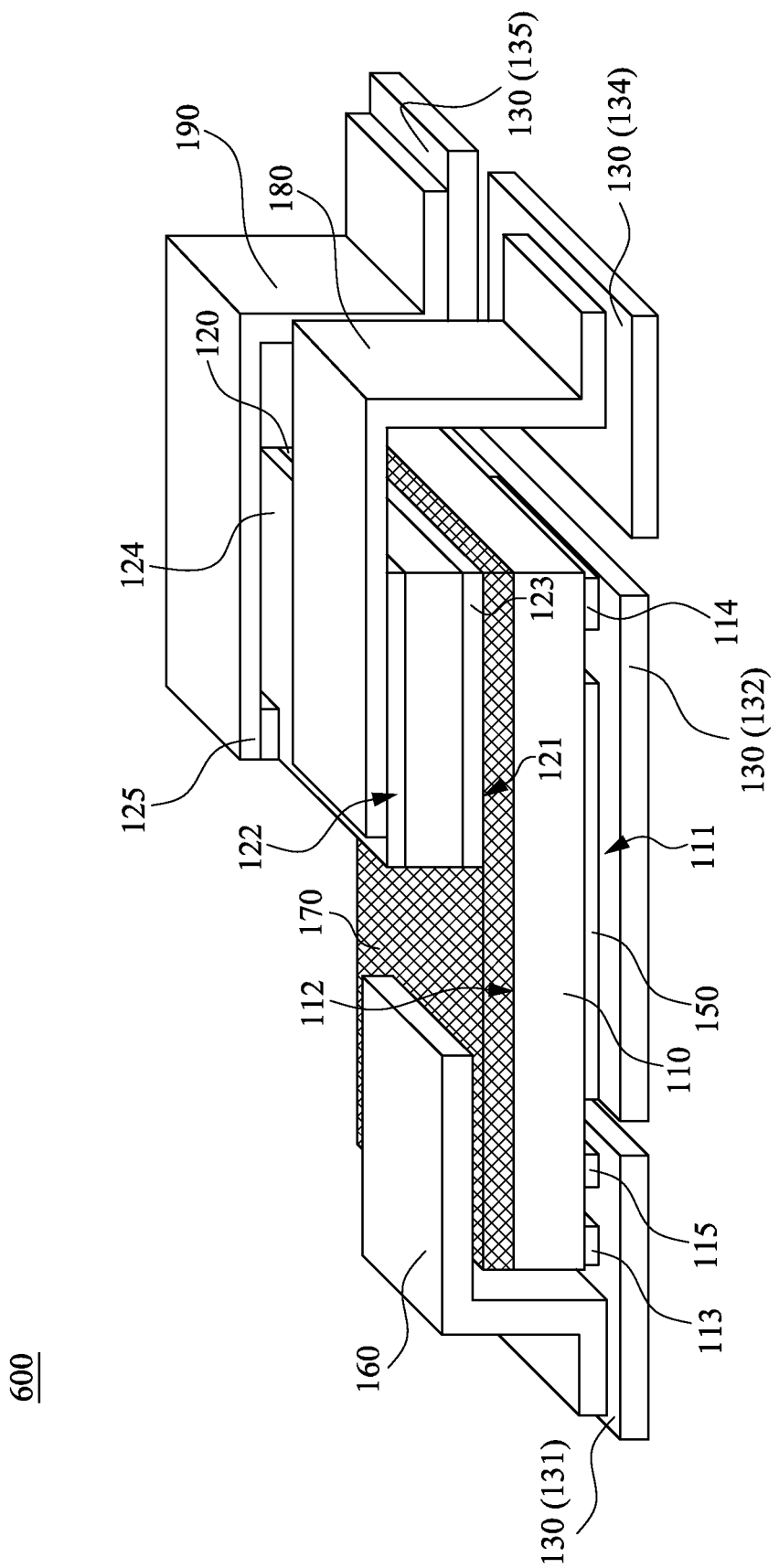
FIG. 6 illustrates the structure of another embodiment of the present disclosure.

In one embodiment of the present disclosure as shown in FIG. 6, the semiconductor component 600 further comprising a third connector 190 contacts both the control electrode 125 of the vertical semiconductor device 120 and the portion 135 of the leadframe 130, and the electrical connection of the control electrode 125 of the vertical semiconductor device 120 and its corresponding portion 135 of the leadframe 130 is also established as the previous embodiments.

Although the present disclosure has been described in considerable detail with reference to certain embodiments thereof, other embodiments are possible. Therefore, the spirit and scope of the appended claims should not be limited to the description of the embodiments contained herein.

It will be apparent to those ordinarily skilled in the art that various modifications and variations may be made to the structure of the present disclosure without departing from the scope or spirit of the disclosure. In view of the foregoing, it is intended that the present disclosure cover modifications and variations thereof provided they fall within the scope of the following claims.

What is claimed is:

1. A semiconductor component comprising:
a lateral semiconductor device having a first side and a second side, the lateral semiconductor device having an active region, positioned on the first side, a first electrode, a second electrode, and a control electrode disposed in the active region on the first side;
a vertical semiconductor device having a first side and a second side, the vertical semiconductor device comprising a first electrode disposed on the first side and a second electrode and a control electrode disposed on the second side;
a conductive layer disposed in between the second side of the lateral semiconductor device and the first side of the vertical semiconductor device; and
a leadframe electrically and respectively connected to each of the first electrode of the lateral semiconductor device, the second electrode of the lateral semiconductor device through flip-chip bonding, the second electrode of the vertical semiconductor device, and the control electrodes,
wherein the first electrode of the vertical semiconductor device is mounted on the conductive layer over the second side of the lateral semiconductor device, and wherein the first electrode of the lateral semiconductor device is electrically connected to the first electrode of the vertical semiconductor device through a first conductive element connecting the conductive layer and the leadframe.

2. The semiconductor component according to claim 1, wherein the first side of the lateral semiconductor device faces to the leadframe.

3. The semiconductor component according to claim 1, wherein the control electrode of the lateral semiconductor device is electrically connected to the first electrode of the vertical semiconductor device.

4. The semiconductor component according to claim 3, further comprising a passivation layer positioned on the first side of the lateral semiconductor device.

5. The semiconductor component according to claim 1, wherein the leadframe comprises a plurality of portions.

6. The semiconductor component according to claim 5, wherein at least two of the plurality of portions are substantially coplanar.

7. The semiconductor component according to claim 5, wherein at least two of the plurality of portions are substantially non-coplanar.

8. The semiconductor component according to claim 1, further comprising a first connector electrically connecting the first electrode of the lateral semiconductor device and the first electrode of the vertical semiconductor device.

9. The semiconductor component according to claim 8, wherein the first electrode of the vertical semiconductor device contacts the conductive layer, and the first connector electrically connects the first electrode of the lateral semiconductor device and the conductive layer.

10. The semiconductor component according to claim 8, wherein the first connector comprises a clip, ribbon, or bonding-wire.

11. The semiconductor component according to claim 1, further comprising a second connector contacts both the second electrode of the vertical semiconductor and the leadframe.

12. The semiconductor component according to claim 11, wherein the second connector comprises a clip, ribbon, or bonding-wire.

13. The semiconductor component according to claim 1, further comprising a third connector contacts both the control electrode of the vertical semiconductor device and the leadframe.

14. The semiconductor component according to claim 13, wherein the third connector comprises a clip, ribbon, or bonding-wire.

15. The semiconductor component according to claim 1, wherein the lateral semiconductor device comprises a metal-insulator-semiconductor field-effect transistor (MISFET), a metal semiconductor field effect transistor (MESFET), or a High-electron-mobility transistor (HEMT).

16. The semiconductor component according to claim 1, wherein the lateral semiconductor device comprises a nitride-based power transistor.

17. The semiconductor component according to claim 1, wherein the first electrode of the lateral semiconductor device is a source electrode, the second electrode of the lateral semiconductor device is a drain electrode, the first electrode of the vertical semiconductor device is a drain electrode, the second electrode of the vertical semiconductor device is a source electrode, and the control electrodes of the lateral and the vertical semiconductor devices are gate electrodes.

18. The semiconductor component according to claim 1, wherein the lateral semiconductor device has a thickness larger than that of the vertical semiconductor device.

19. The semiconductor component according to claim 1, wherein the control electrode of the lateral semiconductor device is electrically connected to the second electrode of the vertical semiconductor device.

20. The semiconductor component according to claim 1, wherein the first conductive element is a metal clip.

* * * * *